US006276772B1

(12) United States Patent
Sakata et al.

(10) Patent No.: US 6,276,772 B1
(45) Date of Patent: Aug. 21, 2001

(54) INK JET PRINTER USING PIEZOELECTRIC ELEMENTS WITH IMPROVED INK DROPLET IMPINGING ACCURACY

(75) Inventors: Masatoshi Sakata; Keiji Kunimi; Takashi Sekino; Kazuo Shimizu, all of Hitachinaka (JP)

(73) Assignee: Hitachi Koki Co., Ltd., Tokyo (JP)

( * ) Notice: Subject to any disclaimer, the term of this patent is extended or adjusted under 35 U.S.C. 154(b) by 0 days.

(21) Appl. No.: 09/323,228

(22) Filed: Jun. 1, 1999

(30) Foreign Application Priority Data

May 2, 1998 (JP) ... 10-152693
May 29, 1998 (JP) ... 10-149675

(51) Int. Cl.[7] ... B41J 29/38; B41J 2/045; H01L 41/06

(52) U.S. Cl. ... 347/10; 347/68; 310/316.03

(58) Field of Search ... 347/9, 10, 11; 310/316.03, 317

(56) References Cited

U.S. PATENT DOCUMENTS 5,631,675 * 5/1997 Futagawa ... 347/10
5,821,963 * 10/1998 Sutera et al. ... 347/68
5,936,644 * 8/1999 Ono et al. ... 347/10
6,092,886 * 7/2000 Hosono ... 347/10
6,137,208 * 10/2000 Hoffmann et al. ... 310/316.03

* cited by examiner

*Primary Examiner*—John Barlow
*Assistant Examiner*—Alfred Dudding
(74) *Attorney, Agent, or Firm*—McGuireWoods LLP

(57) ABSTRACT

A piezoelectric type ink recording device has piezoelectric elements for ejecting ink droplets. Variation can exist in characteristics of the piezoelectric elements that results in variation in speed at which the piezoelectric elements eject ink droplets. In order to suppress this variation in ejection speed, the ink recording device has a driver shared by all of the piezoelectric elements and a separate discharge control circuit for each piezoelectric element. The driver shared and the separate discharge control circuits output pulses to the piezoelectric elements in synchronization. Each piezoelectric element starts discharging its charge in synchronization with the falling edge of a drive pulse from the driver. As a result, the piezoelectric elements deform during the falling edge of the drive pulse to increase volume of corresponding ink chambers, thereby drawing ink into the ink chambers. However, each piezoelectric element continues discharging for a time determined by the width of the pulse from the corresponding discharge control circuit. In this way, the amount of charge discharged from each piezoelectric element can be individually regulated by changing the pulse waveform applied to each piezoelectric element by the corresponding discharge control circuit.

24 Claims, 13 Drawing Sheets

INK JET PRINTER USING PIEZOELECTRIC ELEMENTS WITH IMPROVED INK DROPLET IMPINGING ACCURACY

BACKGROUND OF THE INVENTION

1. Field of the Invention

The present invention relates to a piezoelectric ink recording device, and more particularly to an ink jet recording device that improves precision of where ink droplets impinge on a recording medium.

2. Description of the Related Art

There has been known an ink jet printer with an ink jet head including piezoelectric elements as actuators for ejecting ink droplets. FIG. 1 shows an example of such an ink jet head. The ink jet head shown in FIG. 1 is for ejecting hot melt ink, which is solid at room temperature and liquefies when heated. As shown in FIG. 1, the ink jet head includes a piezoelectric element 1, a diaphragm 5, and a nozzle plate 4 formed with a nozzle 4*a*. The diaphragm 5 is attached to one side of the piezoelectric element 1. The diaphragm 5 and the nozzle plate 4 define an ink chamber 3. The nozzle 4*a* is formed in the nozzle plate 4 at a position in confrontation with the diaphragm 5.

Although not shown in the drawings, the nozzle plate is formed with a plurality of nozzles 4*a*. The nozzles 4*a* are, for example, arranged in 32 columns and 12 rows, wherein the rows extend in the widthwise direction of the recording medium. The nozzle rows are divided into four groups of three rows each, each group being for one of four different colored ink types. That is, three rows each are designated for black, cyan, magenta, and yellow colored inks. An ink chamber 3 and a piezoelectric element 1 are also provided for each one of the plurality of nozzles.

Ink supplied from an ink tank (not shown) is temporarily held in a manifold 7, and then supplied to the ink chambers 3 through a corresponding ink channel 6. A heater 11 is provided adjacent to the manifold 7. The heater 11 heats the manifold 7 and maintains ink in a melted condition. A driver 10 is connected to the piezoelectric element 1. The driver 10 drives the piezoelectric element 1 in response to print commands from a controller 9.

FIG. 3 shows a configuration of the driver 10. The driver 10 is configured from a piezoelectric element driver 24 and a signal generator 25. A plurality of piezoelectric element drivers 24 are provided in a one-to-one correspondence with the piezoelectric elements 1*a* and 1*b*.

When an ink droplet 8 is to be ejected, the signal generator 25 outputs pulse voltage 2 shown in FIG. 4 having a pulse width W. The pulse voltage 2 is applied to the base of transistors Tr1 and Tr2 of the piezoelectric element driver 24. At this time, DC voltage 18 having a voltage level V is generated from the signal generator 25 and applied to the emitter of the transistor Tr1 and to resistors R1 and R2. As a result, a pulse voltage 20 having the pulse width W shown in FIG. 4 is applied to the piezoelectric element 1*a*. The piezoelectric element 1*a* deforms in association with the rising edge of the pulse voltage 20. The diaphragm 5 bends as indicated by a broken line 5*a* in FIG. 2. The volume in the ink chamber 3 increases in association with this, so that ink in the manifold 7 is drawn into the ink chamber 3 through the ink channel 6. Afterwards, the piezoelectric element 1 reverts to its initial shape in association with the falling edge of the pulse voltage 20. Accordingly, the volume of the ink chamber 3 decreases so that the ink droplet 8 is ejected from the nozzle 4*a*. On the other hand, when an ink droplet 8 is not to be ejected, the signal generator 25 is controlled so as not to generate the pulse voltage 2.

A laminated type piezoelectric element shown in FIG. 5 is capable of deforming the diaphragm 5 by a greater amount than other types of piezoelectric elements, so that the piezoelectric element can be driven with good energy efficiency.

However, in the above-described ink jet head, each of the piezoelectric elements has different properties for converting electrical to mechanical power. Also, different piezoelectric elements and corresponding diaphragms are coupled by different amounts and have different positional relationships. Because of these types of variation, the speed at which an ink droplet is ejected can vary depending on the nozzle. When more than one type of variation appears simultaneously in the nozzles, the problem of variation in ejection speed is compounded.

An ink jet head having the above-described variations can not print images with good quality. For example, when such a head is transported at a fixed speed across the width of a recording medium in order to print on the recording medium, the ink droplets can not be impinged at desired locations on the recording medium. The resulting printed image has poor quality. Also, the volume of ink in each ejected droplet can vary. Those nozzle that eject ink droplets with volume outside a certain range can be discarded at the factory in order to reduce variation in amount of ejected ink. However, this reduces the poor of ink jet heads.

The speed at which the ink droplets are ejected from a nozzle can be controlled by controlling a voltage to be applied to the piezoelectric element. Japanese Patent Laid-Open Publications Nos. HEI-4-310747 and HEI-9-39231 disclose methods for controlling charge and discharge currents for the piezoelectric elements. In Japanese Patent Laid-Open Publication No. HEI-4-310747, charge and discharge currents are controlled in the same manner for all of a plurality of nozzles. In Japanese Patent Laid-Open Publication No. HEI-9-39231, a charge pulse with a fixed voltage and a narrow pulse width is repeatedly applied to piezoelectric element circuits having a charge resistor and a discharge resistor. Based on how many narrow pulses produced the optimum printing results for various environments and ink types, a drive waveform for all of the piezoelectric element circuits is determined and stored in a ROM.

The methods disclosed in both of these Japanese Patent Laid-Open Publications uses digitally configured drive waveforms with a pulse width and voltage common for each of the plurality of nozzles. The drive waveform is not controlled differently for each of the nozzles.

SUMMARY OF THE INVENTION

It is an object of the present invention to individually control drive waveform applied to each of a plurality of piezoelectric elements in order to correct for variation in ejection speed of ink droplets ejected from nozzles and improve precision of impinging position of ink droplets on a recording medium.

It is also an object of the present invention to enable modifying waveforms of voltage pulses for individual ejection nozzles of a multi-nozzle ink jet recording device and to improve the yield when manufacturing ink ejection nozzles.

To achieve the above and other objects, there is provided a multi-nozzle type ink jet recording device that ejects ink filling ink chambers from nozzles by using piezoelectric elements to change volume in the ink chambers. The ink jet recording device includes a signal generator, a plurality of charge control circuits, a signal pulse drive circuit, and a plurality of diodes. The signal generator generates a drive signal for driving the piezoelectric elements. The charge control circuits are connected to the signal generator and provided in one-to-one correspondence with the piezoelectric elements. Each charge control circuit is responsive to the drive signal to charge a corresponding piezoelectric element by a predetermined charge amount. The signal pulse drive circuit generates a drive voltage in synchronization with the drive signal. The diodes are also provided in one-to-one correspondence with the piezoelectric elements. Each diode is connected between the signal pulse drive circuit and a corresponding one of the charge control circuits. One connection terminal of each piezoelectric element is connected between an anode terminal of a corresponding diode and a corresponding charge control circuit and another connection terminal of the piezoelectric element is connected to ground.

A pulse from the signal pulse drive circuit includes a linear rising edge, and a time constant at the rising edge of the pulse is set to 0.8 to 1.2 times of a multiple of a reciprocal of a natural frequency of a vibration system including a corresponding piezoelectric element.

The charge amount of each piezoelectric element is determined depending on pulse voltage of the signal pulse drive circuit and pulse width applied to the charge control charge circuit.

The ink may be a hot melt ink. When using the hot melt ink, a heater needs to be provided for heating the hot melt ink to a temperature in a range from 80° C. to 140° C. The heater is disposed adjacent to each ink chamber.

Each charge control circuit starts charging the corresponding piezoelectric element in synchronization with rising edge of the pulse from the signal pulse drive circuit in order to charge the corresponding piezoelectric element with a predetermined particular charge amount, thereby increasing volume of an ink chamber corresponding to the piezoelectric element so that ink is drawn into the ink chamber. Also, each charge control circuit is controlled not to charge the corresponding piezoelectric element.

BRIEF DESCRIPTION OF THE DRAWINGS

The above and other objects, features and advantages of the invention will become more apparent from reading the following description of the preferred embodiment taken in connection with the accompanying drawings in which:

FIG. 6(*b*) is a modification of the driver shown in FIG. 6(*a*);

FIG. 8(*b*) is a view showing voltage waveforms according to the first embodiment applied to piezoelectric elements;

FIG. 8(*c*) is a view showing voltage waveforms according to the first embodiment applied to piezoelectric elements;

FIG. 10(*b*) is a graph showing ejection speed of different nozzles in an ink jet recording device according to the first embodiment;

FIG. 13(*b*) is a modification of the driver shown in FIG. 13(*a*);

FIG. 15(*b*) is a view showing a voltage waveform used by the circuit configuration of FIG. 14 for controlling piezoelectric elements;

FIG. 15(*c*) is a view for explaining voltage waveforms used by the circuit configuration of FIG. 14 for controlling piezoelectric elements;

FIG. 18(*b*) is a view for explaining voltage waveforms used by the circuit configuration according to the present invention for controlling piezoelectric elements;

FIG. 20(*b*) is a view for explaining voltage waveform used by the circuit shown in FIG. 19.

DETAILED DESCRIPTION OF THE EMBODIMENTS

Figure 1:
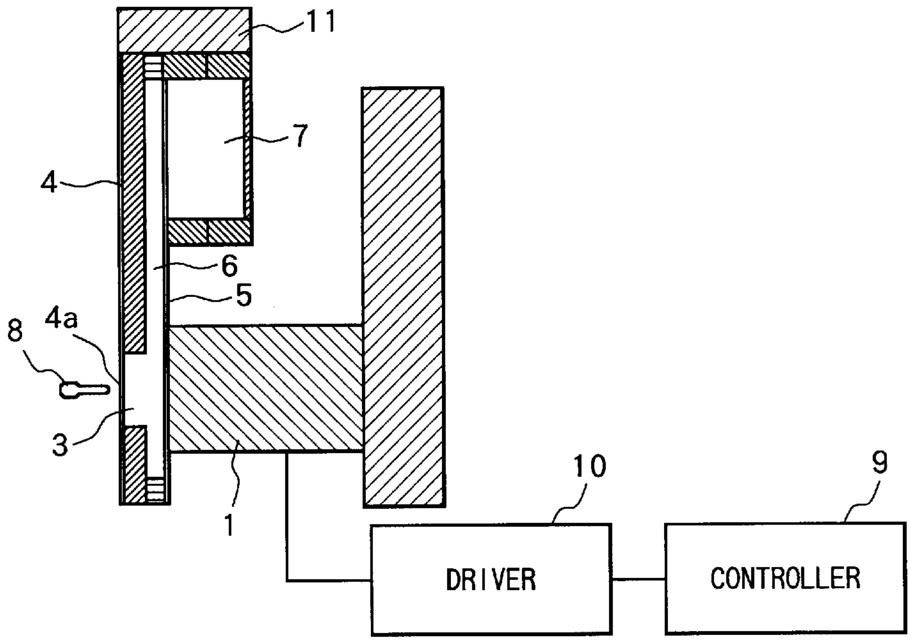
FIG. 1 PRIOR ART
FIG. 1 is a cross-sectional view showing essential components of a conventional piezoelectric type ink jet head in a normal condition.
Figure 2:
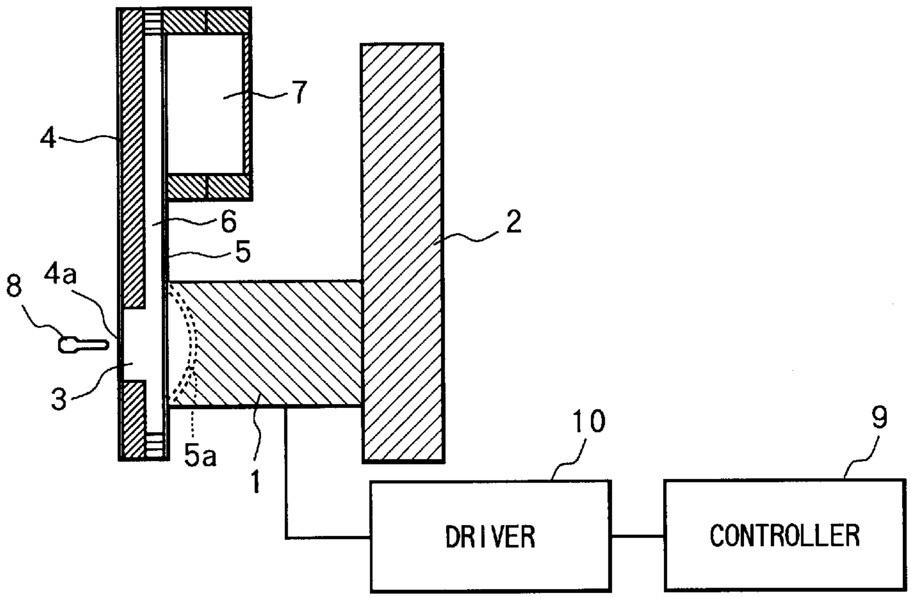
FIG. 2 PRIOR ART
FIG. 2 is a schematic cross-sectional view showing the head of FIG. 1 in a driven condition.
Figure 3:
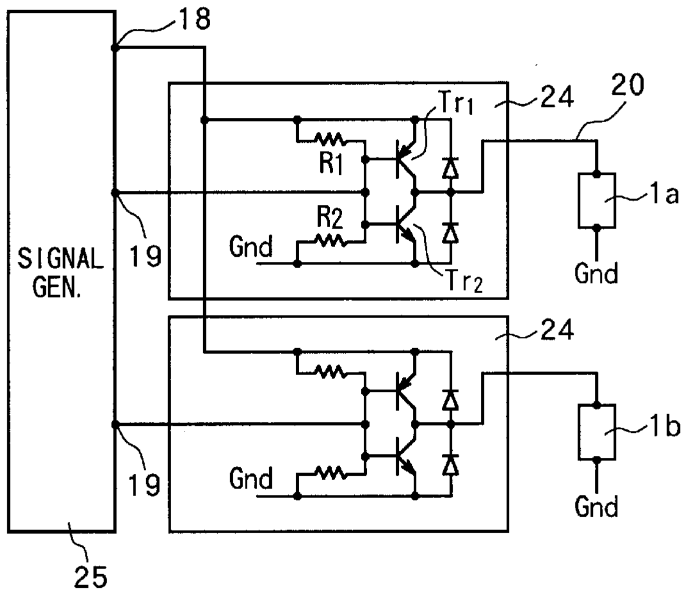
FIG. 3 PRIOR ART
FIG. 3 is a circuit diagram showing configuration of a driver of the head of FIG. 1.
Figure 4:
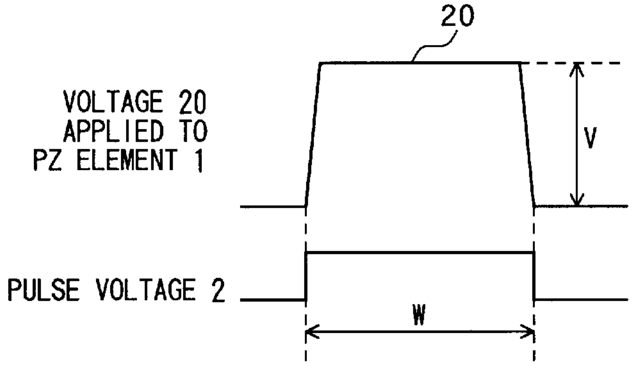
FIG. 4 PRIOR ART
FIG. 4 is a view showing a voltage waveform used by the driver of FIG. 3 to control piezoelectric elements.
Figure 5:
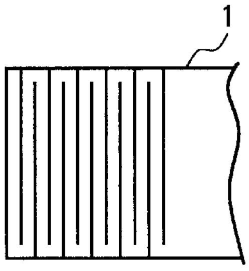
FIG. 5 is a schematic view showing a laminated type piezoelectric element of the head of FIG. 1.

Ink jet printers according to embodiments of the present invention will be described while referring to the accompanying drawings wherein like parts and components are designated by the same reference numerals to avoid duplicating description.

An ink recording device according to a first embodiment ejects ink droplets of a liquid ink, that is, the ink is a liquid at room temperature. Therefore, the heater 11 is not provided to the ink recording device of the first embodiment.

Figure 6:
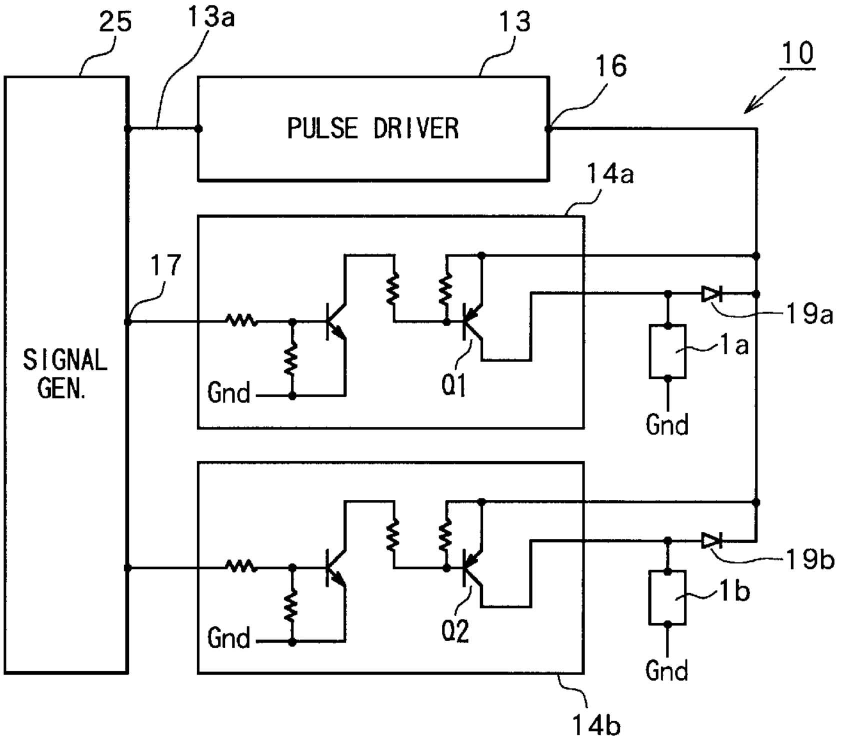
FIG. 6(*a*) is a circuit diagram showing a driver according to a first embodiment of the present invention.
Figure 6:
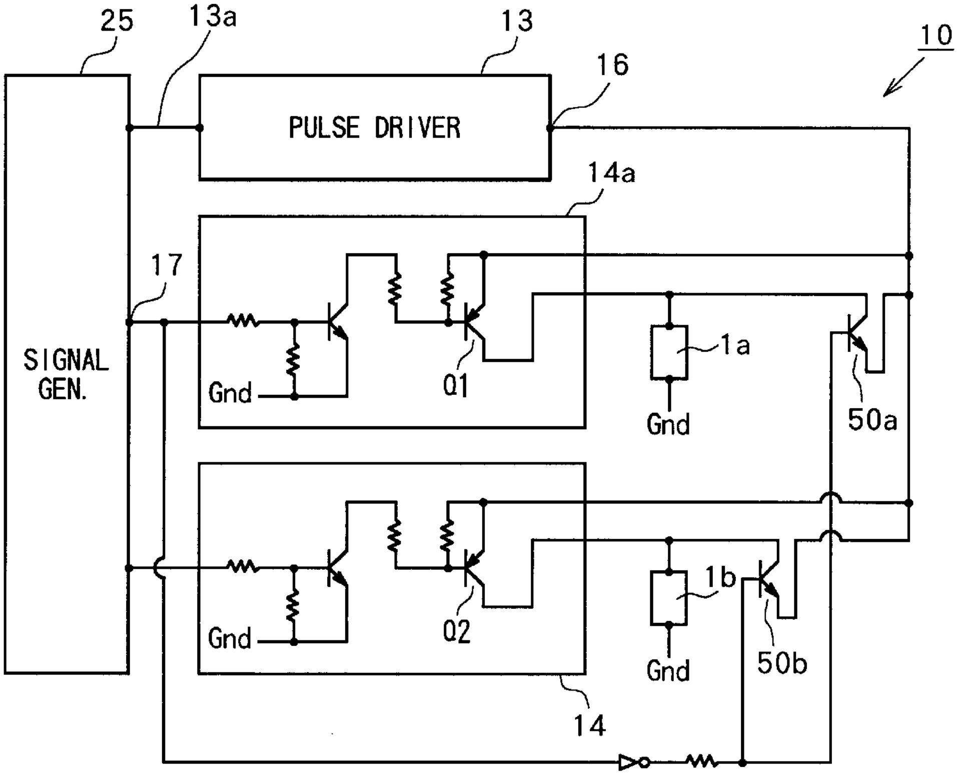

First, while referring to FIG. 6, the configuration of a driver 10 according to a first embodiment will be described. As shown in FIG. 6, the driver 10 includes a pulse driver 13, charge control circuits 14*a* and 14*b*, a signal generator 25, and diodes 19*a* and 19*b*. More specifically, a plurality of charge control circuits 14*a* and 14*b* and diodes 19*a* and 19*b* are provided in one-to-one correspondence with the piezoelectric elements 1*a* and 1*b*. The pulse driver 13 and each of the charge control circuits are connected to the signal generator 25. Each charge control circuit includes transistors, labeled Q1 and Q2 respectively. The collector of transistors Q1 and Q2 is connected to one terminal of the corresponding piezoelectric diode. The emitter of the transistors Q1 and Q2 and the cathode of the diode are connected to a shared output terminal 16 of the pulse driver 13. The other terminal of the piezoelectric elements 1*a* and 1*b* is connected to ground.

Figure 7:
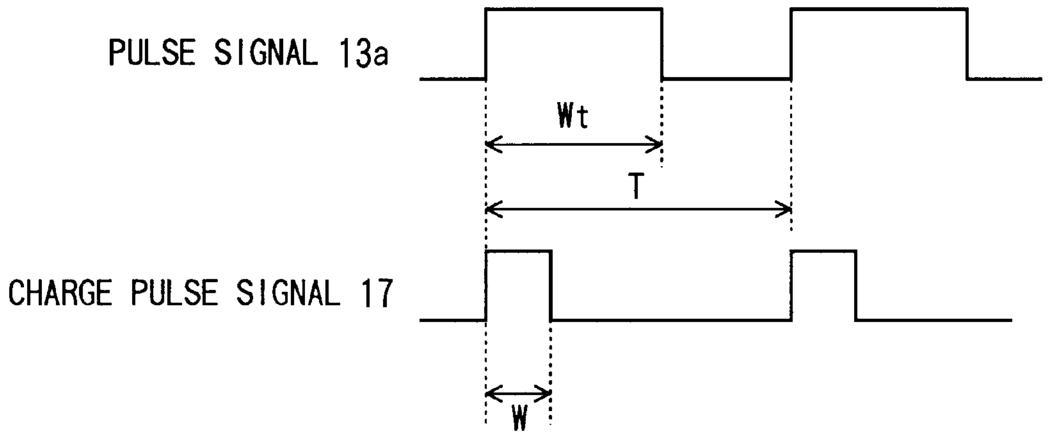
FIG. 7 is a view showing waveforms of a pulse signal and a charge pulse signal outputted from a signal generator of the driver of FIG. 6.

When the signal generator 25 receives a print command from a controller 9, the signal generator 25 outputs a charge pulse signal 17 shown in FIG. 7 to the charge control circuits 140. The charge pulse signal 17 has a pulse width W, which is preset in accordance with the driver characteristics of the corresponding piezoelectric elements 1*a* and 1*b*. As will be described later, the pulse of voltage (FIG. 8(*b*)) ultimately applied to the piezoelectric elements are linearly controlled in accordance to the pulse width W. In addition, each time a predetermined time duration T elapses, the signal generator 25 outputs a pulse signal 13*a*, which has a pulse width Wt over one period, to the pulse driver 13. In association with this, that is, each time the predetermined time duration T elapses, the pulse driver 13 generates an output voltage 16 having the trapezoidal waveform shown in FIG. 8(*a*). It should be noted that the rising edge of the pulse signal 13*a* is synchronized with the rising edge of the charge pulse signal 17. Also, generation of the output 16 is synchronized with the pulse signal 13*a*, so that the output 16 is rises from the rising edge and lowers from the falling edge.

In the circuit of FIG. 6(*b*) the diodes 19 serve as a discharge circuit for discharging the piezoelectric elements. The discharge circuit can be configured without using diodes. As shown in FIG. 6(*b*), the discharge circuit may be configured by respective transistors 50. In this configuration, the collector of transistors Q1 and Q2 is connected to one terminal of the corresponding piezoelectric elements 1*a* and 1*b* and also to the collector of the transistors 50*a* and 50*b*, respectively. The emitter of the transistors Q1 and Q2 and the emitter of the transistors 50*a* and 50*b* are connected to a shared output terminal 16 of the pulse driver 13. The base of the transistors 50*a* and 50*b* is connected to the signal generator 25 outputting the charge pulse signal 17.

Figure 9:
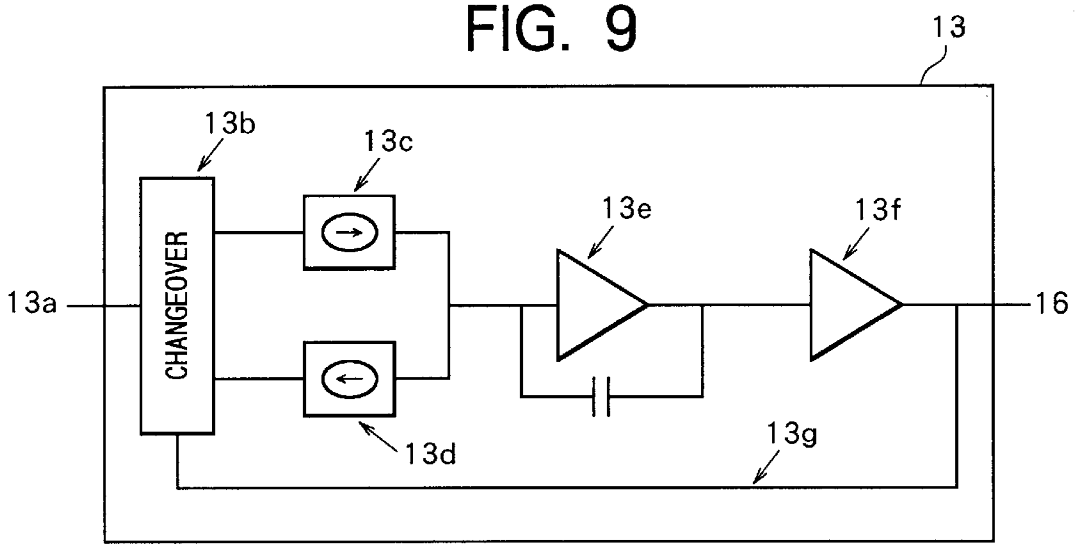
FIG. 9 is a circuit diagram showing configuration of the pulse driver according to the first embodiment.

Next, the pulse driver 13 will be described while referring to FIG. 9. As shown in FIG. 9, the pulse driver 13 includes a changeover circuit 13*b*, a positive current source 13*c*, a negative current source 13*d*, an integrator 13*e*, an amplifier 13*f*, and a feedback line 13*g*. The positive current source 13*c* and the negative current source 13*d* are both constant current sources and both connected to the changeover circuit 13*b*. The positive current source 13*c* and the negative current source 13*d* are also connected to the amplifier 13*f* through the integrator 13*e*. The output of the amplifier 13*f* is connected to the changeover circuit 13*b* through the feedback line 13*g*. The integrator 13*e* includes an integrating capacitor.

When the pulse signal 13*a* from the signal generator 25 is at a high level, the changeover circuit 13*b* switches so that the positive current source 13*c* charges the integrating capacitor. As a result, the voltage outputted from the integrator 13*e* rises in a linear manner. The voltage outputted from the integrator 13*e* is increased by the amplifier 13*f*, resulting in the output 16 of the pulse driver 13. The changeover circuit 13*b* uses the feedback line 13*g* to sense when the output 16 has reached a predetermined voltage Vmax, whereupon the changeover circuit 13*b* turns the positive current source 13*c* off.

When the pulse signal 13*a* reverts to a low level, the changeover circuit 13*b* turns on the negative current source 13*d*. As a result, the integrating capacitor of the integrator 13*e* discharges so that the output 16 decreases in a linear manner. When the output 16 reaches the voltage Vg, the changeover circuit 13*b* turns the negative current source 13*d* off.

In this way, the pulse driver 13 generates the pulse drive voltage 16 in synchronization with the rising edge or the charge pulse signal 17.

Next, control for charging the piezoelectric element 1 will be described. For this description, it will be assumed that the pulse width W of the charge pulse signal 17 is set to a minimum width Wmin. In this case, a minimum charge voltage Cmin shown in FIG. 8(*c*) is applied to the piezoelectric element 1. The charge pulse signal 17 that corresponds to a maximum charge voltage Cmax has a pulse width Wmax. The rising time constant at a time when ink is being drawn into an ink chamber is at maximum with the pulse width Wmax.

Figure 8:
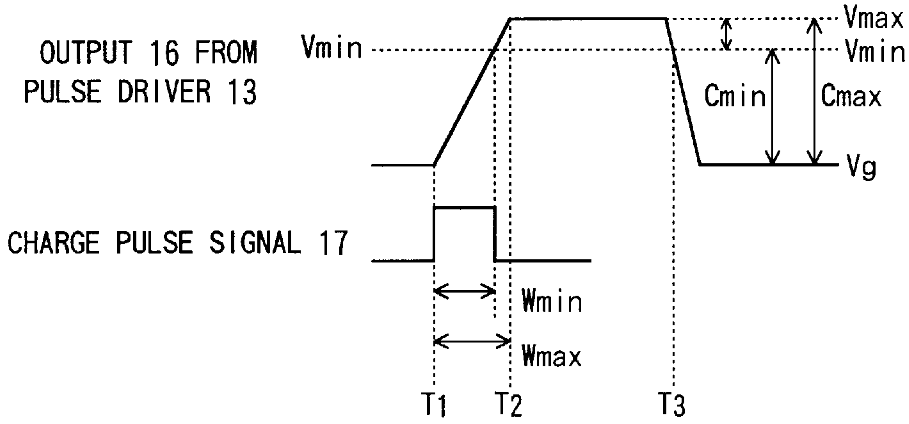
FIG. 8(*a*) is a view showing voltage waveforms according to the first embodiment used to control piezoelectric elements.
Figure 8:
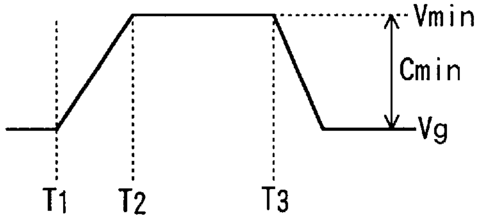
Figure 8:
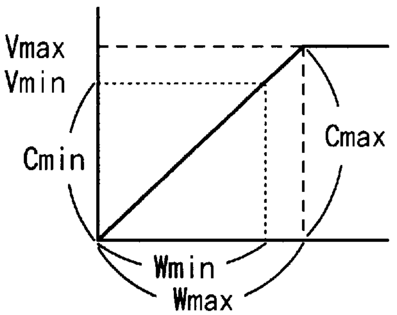

As shown in FIG. 8(*a*), when the charge pulse signal 17 rises to a high level at timing T1, the transistor Q1 is rendered conductive. Simultaneously, as shown in FIG. 8(*a*), the voltage value of the output 16 from the pulse driver 13 linearly increases from the voltage value Vg. In accordance with this, the piezoelectric element 1 is charged as shown in FIG. 8(*b*).

Next, when the charge pulse signal 17 switches to a low level at a timing T2, the transistor Q1 is rendered non-conductive. Because of this, charging of the piezoelectric element 1 is stopped. At timing T2, the output 16 applied to the piezoelectric element 1 has a voltage value of the Vmin. After the timing T2, the output 16 continuously increases until its voltage reaches the voltage Vmax. However, because the charge pulse signal 17 is maintained at its low level, the voltage applied to the piezoelectric element 1 is maintained at the minimum voltage Vmin. Therefore, the piezoelectric element 1 does not charge any further.

In this way, the piezoelectric element 1 is charged by the minimum voltage Vmin. In association with this charging operation, the piezoelectric element 1 contracts so that the diaphragm 5 deforms and ink is drawn into the ink chamber 3. Next, as shown in FIGS. 8(*a*) and 8(*b*), the trapezoidal pulse drive voltage 16 starts to drop at the falling edge of the pulse signal 13*a*. In synchronization with this, from a timing T3 a charge amount corresponding to the minimum voltage Cmin, at which the piezoelectric element 1 is charged, is discharged through the diode 19. As a result, an ink droplet 8 is ejected from the nozzle 4*a*. It should be noted that the preceding description does not take into account the voltage drop at the transistor Q1 when the transistor Q1 is rendered ON, nor the voltage drop at the forward biased diode 19. Further, the preceding description does not take into account response delay of the transistor Q1 or of the diode 19.

In accordance with a print command, no charge pulse signal 17 is generated for piezoelectric elements that are not to eject an ink droplet. Therefore, such piezoelectric elements 1 are not charged, so that no ink is drawn into the corresponding ink chamber and no ink droplet 8 is ejected.

The time constant of the pulse drive voltage 16 at a time of rising is set to 0.8 to 1.2 times a multiple of the reciprocal of the natural frequency or the vibration system that includes the piezoelectric element 1. By setting the time constant in this manner, harmonic vibration can be suppressed. By suppressing the harmonic vibration in this manner, a turbulence in the liquid ink drawn into the chamber can be suppressed and ink can be more stably ejected. Also, variation between different piezoelectric elements can be corrected in a manner to be described later with optimum effectiveness.

According to the present embodiment, when the natural frequency of the vibration is 100 Khz, then the minimum pulse width Wmin is set to 8 $\mu$s and the maximum pulse width Wmax of the charge pulse signal 17 is set to 12 $\mu$s (i.e., 0.8 to 1.2×10 $\mu$s (1/100 Khz)=8 to 12 $\mu$s). A voltage corresponding to the set voltage width, that is, a voltage within the range of Vmin to Vmax, is set for each piezoelectric element as a pulse drive voltage. In the situation when two is used as the multiple of the reciprocal of the natural frequency, the minimum pulse width Wmin is set to 16$\mu$ seconds and the maximum pulse width Wmax is set to 24$\mu$ seconds.

Figure 10:
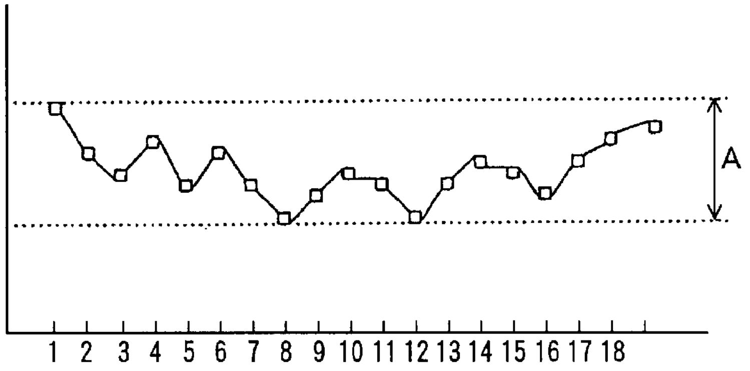
FIG. 10 (a) PRIOR ART
FIG. 10(*a*) is a graph showing ejection speed of different nozzles in a conventional ink jet recording device.
Figure 10:
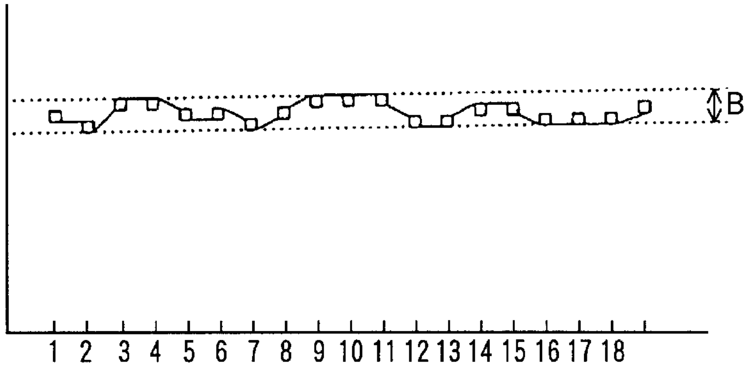

FIG. 10(*a*) shows ejection speed of droplets achieved using a conventional control method. Variation in speed extends with a range A. In contrast to this, FIG. 10(*b*) shows ejection speed of ink droplets ejected using configuration according to the present invention. As can be seen, variation in speed extends with a range B, which is much narrower than the range A. It can be seen from these drawings that the variation range B is much improved over the variation range A. Because variation in the ejection speed of ink droplets, which is caused by differences in ink ejection systems including piezoelectric elements, is corrected so that ink droplets from different nozzles are ejected at the same speed, precision of where the ink droplets impinge on the recording medium can be greatly improved.

The ink ejection speed of an ink ejecting system including a piezoelectric element can be premeasured. Alternatively, variation in impinging position with respect to a model printing pattern can be measured. The results can be stored in a ROM (not shown) as voltage trimming values for each piezoelectric element. The pulse width of the charge pulse signal 17 can be easily controlled using these voltage trimming values and the signal generator 25.

According to the present invention, each piezoelectric element can be controlled to charge in order to suppress variation between nozzles in ink droplet ejection speed, thereby improving precision where ink droplets impinge on the recording medium. Also, the pulse width of drive pulses applied to piezoelectric elements of ink drop nozzles in a multi-nozzle ink jet recording device can be individually adjusted separately for each piezoelectric element. As a result, yield when producing the ink ejection nozzles can be improved.

Figure 11:
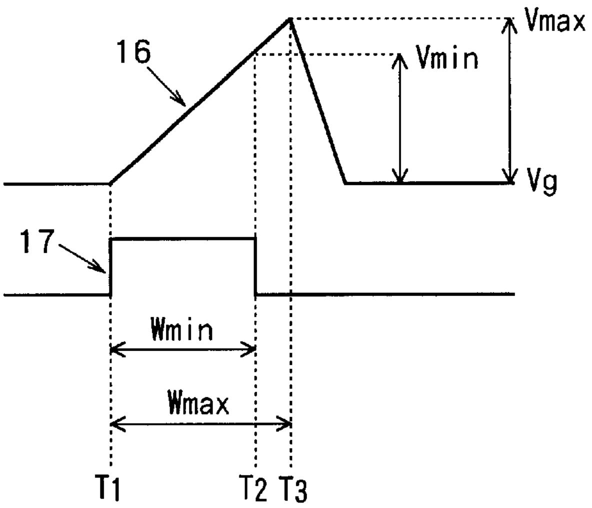
FIG. 11 is view showing another example of a waveform according to the first embodiment for controlling piezoelectric elements.

The present embodiment describes the pulse drive waveform of the pulse drive voltage 16 as having the trapezoidal shape shown in FIG. 8(*a*). However, the pulse drive waveform needs to have a rising edge that rises in a linear manner. For example, the pulse drive voltage can have a triangular waveform as shown in FIG. 11. Also, the lowering voltage from the timing T3 and on can have a parabolic shape or sinusoidal shape. There is no need for the pulse to have an overall trapezoidal shape.

Figure 12:
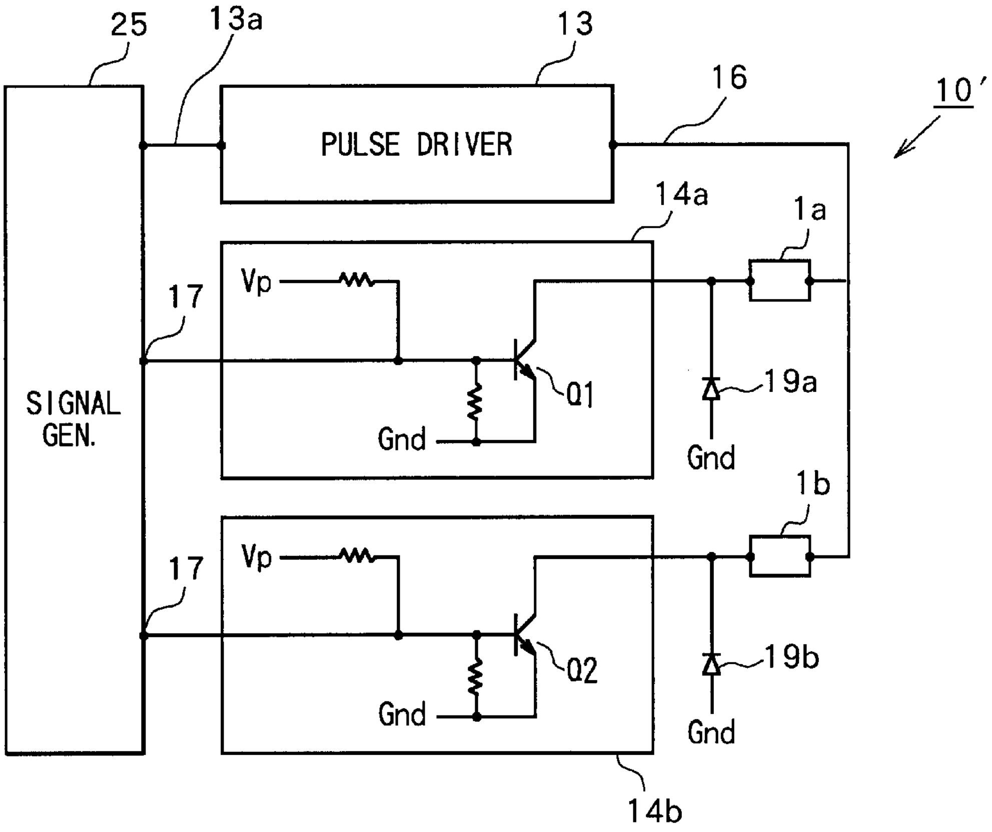
FIG. 12 is circuit drawing showing a driver according to another example of first embodiment.

Next, a modification of the first embodiment will be described while referring to FIG. 12. In a pulse driver 10' according to the modification, the cathodes of the diodes 19*a* and 19*b* are connected between respective charge control circuits 14*a* and 14*b* and the piezoelectric elements 1*a* and 1*b*, and the anodes of the diodes 19*a* and 19*b* are connected to a ground voltage Vg.

With this configuration also, while the charge pulse signal 17 is set at a high level, the transistors Q1 and Q2 in the charge control circuits 14*a* and 14*b* are rendered conductive so that the piezoelectric elements are charged. When the charge pulse signal 16 lowers from the high level to a low level by the charge amount Vmin, the transistors Q1 and Q2 are rendered non-conductive so that charging of the piezoelectric elements are stopped. Afterwards, even though the voltage of the output 16 rises to the maximum voltage of the Vmax, the piezoelectric elements will charge no further. Then at timing T3, the voltage waveform of the output 16 starts to drop. Once the falling edge of the waveform of output 16 drops to the voltage Vmin, then the charge of the piezoelectric elements start to discharge through the diode. Afterward, the charge from the piezoelectric elements are discharged in synchronization with the falling edge of the waveform of the output 16. When the charge corresponding to the voltage Cmin, at which the piezoelectric elements were charged, is discharged though the diodes 19, an ink droplet 8 is ejected from the nozzle 4. With this circuit configuration also, in the same manner as in the first embodiment, variation in ejection speed of different ink ejecting systems can be corrected so that precision at which ink impinged on the recording medium can be improved.

Next, a second embodiment of the present invention will be described.

Figure 13:
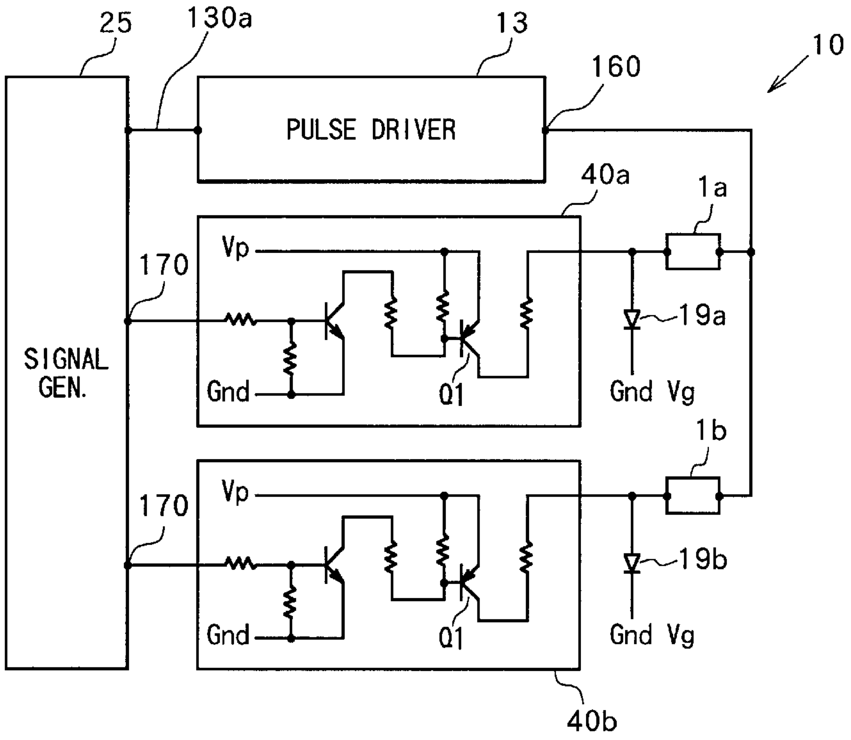
FIG. 13(*a*) is circuit drawing showing a driver according to a second embodiment of the present invention.
Figure 13:
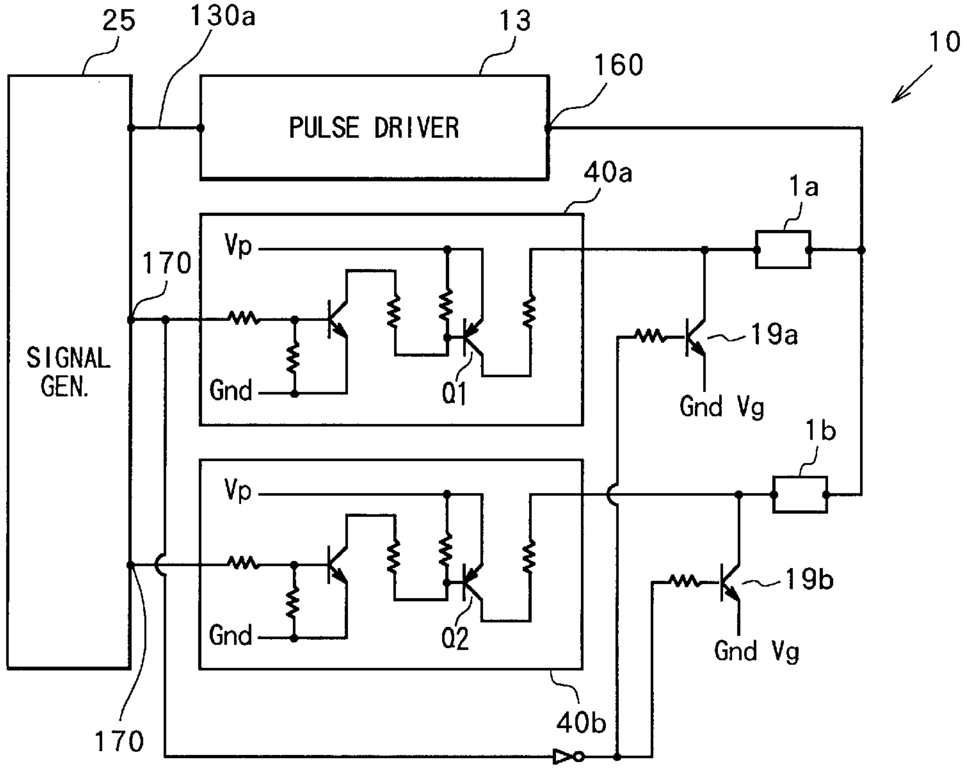

As shown in FIG. 13(*a*), a driver 10 includes the pulse driver 13, discharge control circuits 40*a* and 40*b*, a signal generator 25, and diodes 19*a* and 19*b*. The discharge control circuits 40*a* and 40*b* and the diodes 19 are provided in a one-to-one correspondence with the piezoelectric elements 1*a* and 1*b*. The pulse driver 13 and the discharge control circuits 40*a* and 40*b* are all connected to the signal generator 25. One terminal of each piezoelectric element is connected in parallel with the output-side terminal of the pulse driver 13. The other terminal of each piezoelectric element is connected to the corresponding discharge control circuit, and to the anode of the corresponding diode 19. The cathode of each diode 19 is connected to a ground voltage Vg. The pulse driver 13 outputs a pulse drive voltage 160. It should be noted that when the minimum potential Vmin of the pulse driver 13 is lower than the ground potential Vg, the cathode of the diode need not be connected to ground, but could instead be provided with the same minimum potential Vmin of the output 160.

Figure 14:
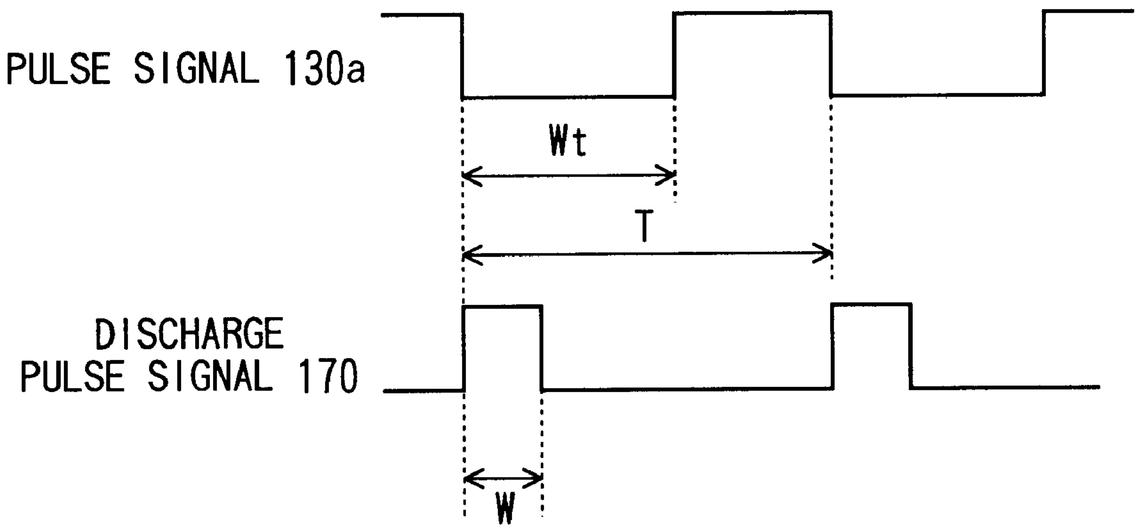
FIG. 14 is a view showing waveforms of a pulse signal applied to a pulse driver and a charge pulse signal applied to a driver of FIG. 13.

When the signal generator 25 receives a print command from the controller 9, the signal generator 25 outputs a discharge pulse signal 170 shown in FIG. 14 to the discharge control circuit. A pulse width of the discharge pulse signal 170 is preset to match the drive characteristic of the corresponding piezoelectric elements. As will be described later, the piezoelectric elements are controlled to discharge voltage linearly in accordance with the pulse width of the discharge pulse signal 170. The signal generator 25 outputs a pulse signal 130*a* having the pulse width Wt to the pulse driver 13 each time a predetermine time duration T elapses. In association with this, that is, each time the predetermined time duration T elapses, the pulse driver 14 generates output 160 with the trapezoidal waveform shown in FIG. 15(*a*). The lowering edge of the pulse signal 130*a* is synchronized with the rising edge of the discharge pulse signal 170. The generation of the output 160 is synchronized with the rising edge of the discharge pulse signal 170.

The output 160 has a maximum voltage Vmax. The discharge pulse signal 170 has a maximum pulse signal width Wmax, which corresponds to the time required for the output 160 to drop from the maximum voltage Vmax to the voltage Vg.

Figure 15:
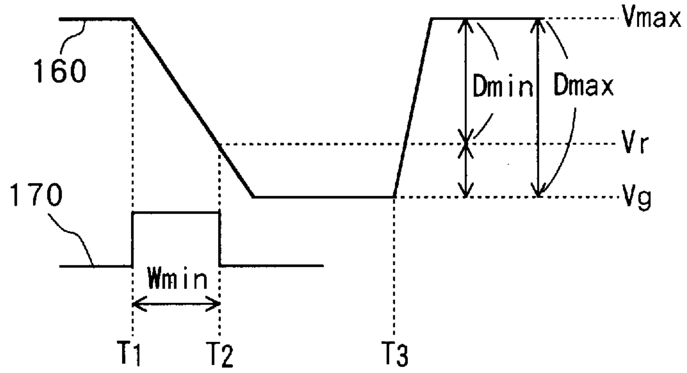
FIG. 15(*a*) is a view showing voltage waveforms used by the circuit configuration of FIG. 14 for controlling piezoelectric elements.
Figure 15:
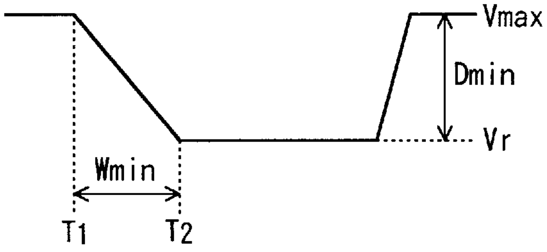
Figure 15:
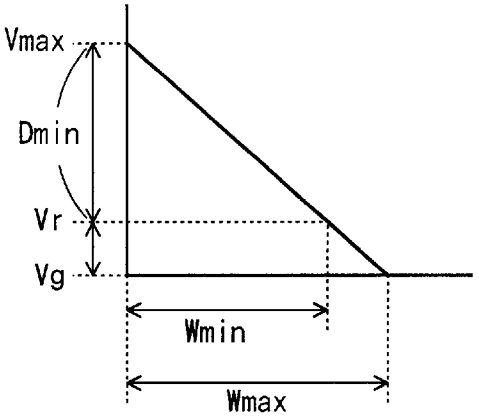

Next, discharge control according to the present embodiment will be described. In this description, it will be assumed that the pulse width of the discharge pulse signal 170 is set to minimum width Wmin. In this case, a discharge voltage Dmin is discharged from the piezoelectric element 1 as shown in FIG. 15(*c*). It should be noted that similarly, the maximum pulse width Wmax of the discharge pulse signal 170 corresponds to a maximum discharge voltage Dmax that is discharged from the corresponding piezoelectric element 1.

As shown in FIGS. 15(*a*) and 15(*b*), the output 160 is at the maximum voltage value Vmax, so that the piezoelectric element 1 is charged to the maximum voltage value Vmax. Then at the timing T1, the transistor Q1 is rendered conductive by the discharge pulse signal 170 rising to a high level. Simultaneously with this, the voltage value of the pulse drive voltage 160 from the pulse driver 13 drops linearly from the voltage value Vmax. In association with this, the charge of the piezoelectric element 1 starts to discharge through the diode 19. Next, when the discharge pulse signal 170 switches to the low level at timing T2, the transistor Q1 is rendered non-conductive. As a result of this, the piezoelectric element 1 stops discharging. At the timing T2, the pulse drive voltage 160 has a voltage value Vr. In the interval from timing T1 to T2, a discharge voltage Dmin is discharged from the piezoelectric element 1. At timing T2, the piezoelectric element 1 has a voltage value of the Vr. After timing T2, because the discharge pulse signal 170 is maintained at a low level, the charge of the piezoelectric element 1 is maintained at the voltage value Vr and will not drop any lower than the voltage value Vr.

In this way, when the discharge voltage D is discharged from the piezoelectric element 1, the piezoelectric element 1 contracts, so ink is drawn into the ink chamber 3. When the output 16 varies at the timing T3, the piezoelectric element 1 is charged in synchronization with the rising edge of the waveform. As a result, contraction of the piezoelectric element 1 is released so that an ink droplet 8 is ejected from the nozzle 4*a*. It should be noted that the charge of the piezoelectric element 1 at this time can be determined using the following formula:

(maximum voltage Vmax of the output 160)−(residual voltage Vr of the piezoelectric element 1)=(charge corresponding to the voltage Dmin).

FIG. 13(*b*) is a modification of the circuit of FIG. 13(*a*), wherein a transistor 50 is used in lieu of the diodes 19*a* and 19*b* shown in FIG. 13(*a*) for charging the corresponding piezoelectric element.

The preceding description does not take into account the voltage drop at the transistors Q1 and Q2 when these transistors are rendered ON, nor the voltage drop at the forward biased diode. Further, the preceding description does not take into account response delay of the transistors Q1 and Q2 or of the diode.

Figure 16:
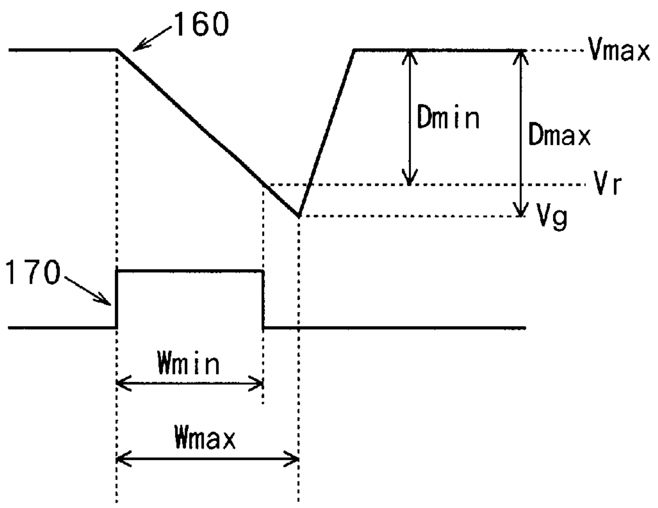
FIG. 16 is a view showing voltage waveforms used by the circuit configuration according to the present invention for controlling piezoelectric elements.

It should be noted that although the second embodiment describes the pulse drive voltage 16 as having the trapezoidal shape shown in FIG. 15(*a*), the waveform of the drive pulse need only have a linear falling edge. For example, the pulse drive voltage 16 can have the triangular waveform shown in FIG. 16(*a*). Alternatively, the rising edge of the voltage after timing T3 can have a sinusoidal waveform or parabolic waveform.

According to the second embodiment, high frequency vibration of the piezoelectric element 1 can be suppressed by setting the time constant at the falling edge of the pulse drive voltage 160 to 0.8 to 1.2 times a multiple of the reciprocal of the natural frequency of the vibration system that includes the piezoelectric element 1. For example, when the natural frequency of the vibration is 100 Khz, then the minimum pulse width Wmin is set to 8 μs and the maximum pulse width Wmax of the charge pulse signal 17 is set to 12 μs. A voltage corresponding to the set voltage width, that is, a voltage within the range of Vmin to Vmax, is set for each piezoelectric element as a pulse drive voltage. In the situation when two is used as the multiple of the reciprocal of the natural frequency, the minimum pulse width Wmin is set to 16μ seconds and the maximum pulse width Wmax is set to 24μ seconds.

Figure 17:
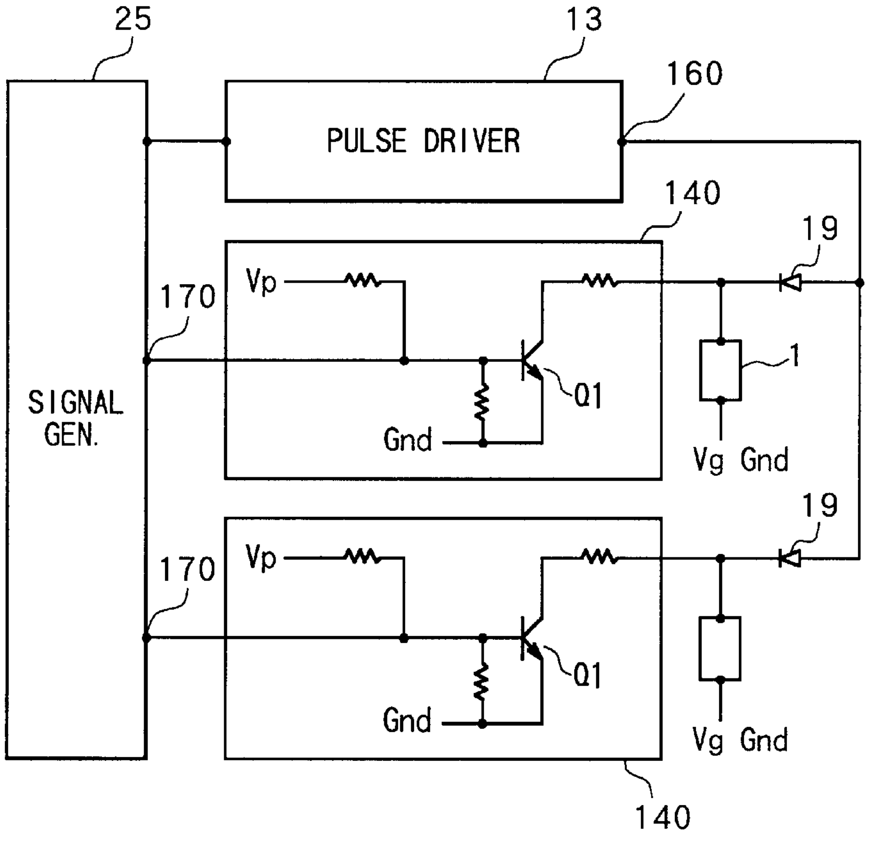
FIG. 17 is a circuit drawing showing another example of a driver according to the second embodiment of the present invention.

Next, a modification of the second embodiment will be described. As shown in FIG. 17, one terminal of each piezoelectric element 1 is connected to a ground potential Vg. The other terminal of each piezoelectric element 1 is connected to the discharge control circuit 140 and also to the cathode or the corresponding diode 19, which are provided separately for each piezoelectric element 1. The anode of the diode 19 is connected to a common output potential of the pulse driver 13. It should be noted that one of the terminals of the piezoelectric element 1 can be connected to the minimum potential power source of thee pulse driver 13.

According to this modification, in the same manner as the above-described embodiment, when the pule drive voltage 160 is applied to one of the piezoelectric elements 1, the discharge voltage D is discharged from the piezoelectric element 1 in accordance with the pulse width of the discharge pulse signal 170. As a result, ink is drawn into the ink chamber 3. In synchronization with the rising edge of the pulse drive voltage 160, that is, at the timing T3, the piezoelectric element 1 is charged with a charge corresponding to the discharge voltage D so that an ink droplet 8 is ejected.

Figure 18:
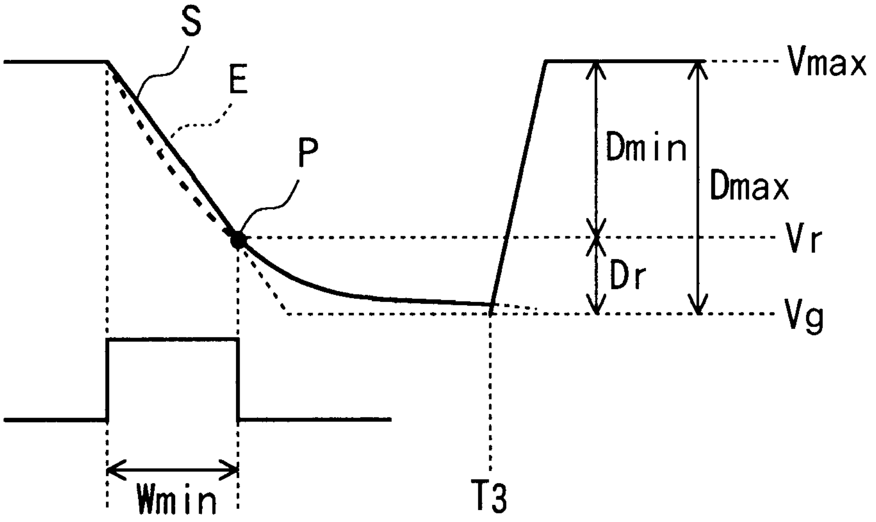
FIG. 18(*a*) is a view showing voltage waveforms used by the circuit configuration according to the present invention for controlling piezoelectric elements.
Figure 18:
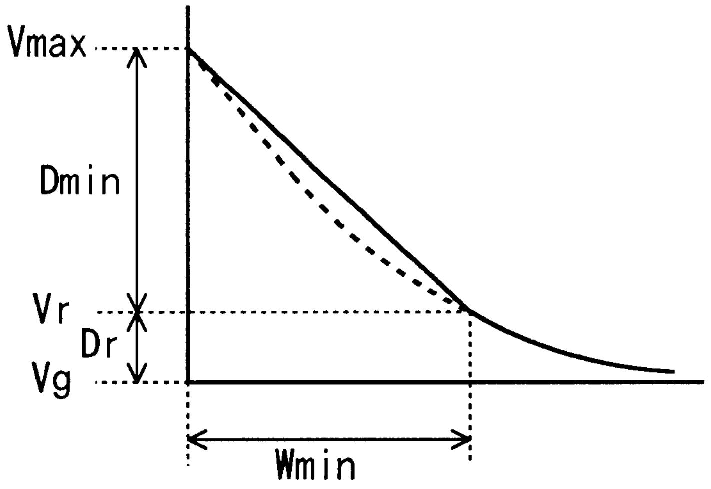

As shown in FIGS. 18(*a*) and 18(*b*), the falling edge of the pulse drive voltage 160 include a straight line S and a curved line E, which intersect at a timing P. The curved line E is an exponential of a time constant and is determined according to the product of the capacitance of the piezoelectric element 1 and the resistance connected in series with the transistor Q1. As shown in FIG. 18(*a*), the voltage of the piezoelectric element 1 follows the straight line S before timing P and follows the curved line E after timing P.

The harmonic vibration of the piezoelectric element 1 can be suppressed by setting resistance against discharge in accordance with the capacitance of the piezoelectric element 1, so that the timing P, when the lowering straight line S and the curved line E intersect, is 0.8 times a multiple of the reciprocal of the natural frequency of the vibration system. Also, with this configuration, the falling edge of the output 160 can be extended longer than when the falling edge of the output 160 is regulated only linearly in accordance with the maximum width value Wmax of the discharge pulse signal 170. Therefore, variation in the piezoelectric elements 1 can be more precisely corrected.

Figure 19:
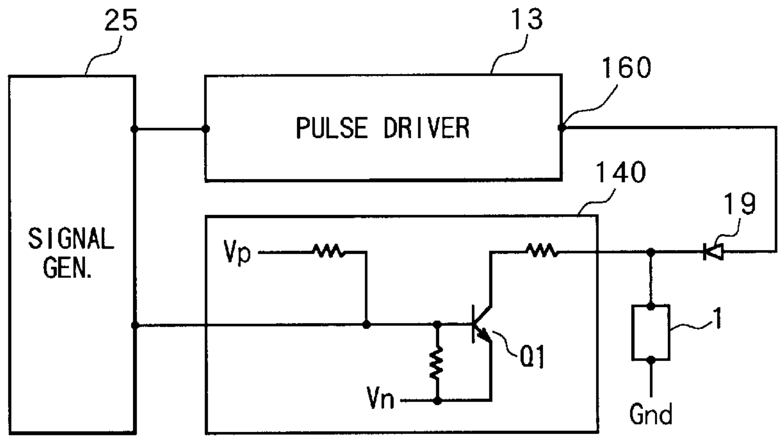
FIG. 19 is circuit drawing showing still another example of a driver according to the second embodiment of the present invention.
Figure 20:
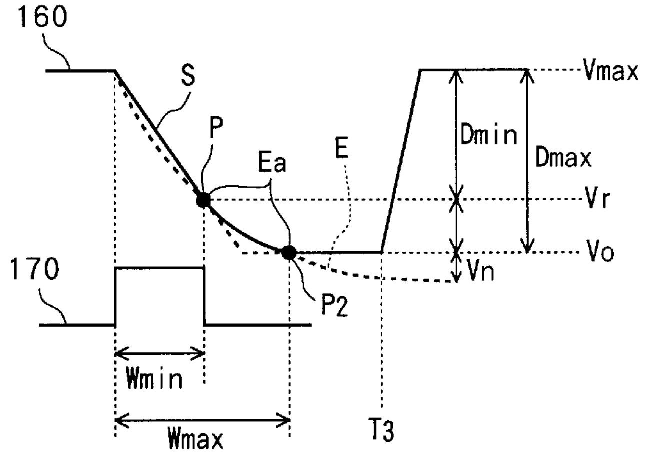
FIG. 20(*a*) is a view showing voltage waveform used by the circuit shown in FIG. 19.
Figure 20:
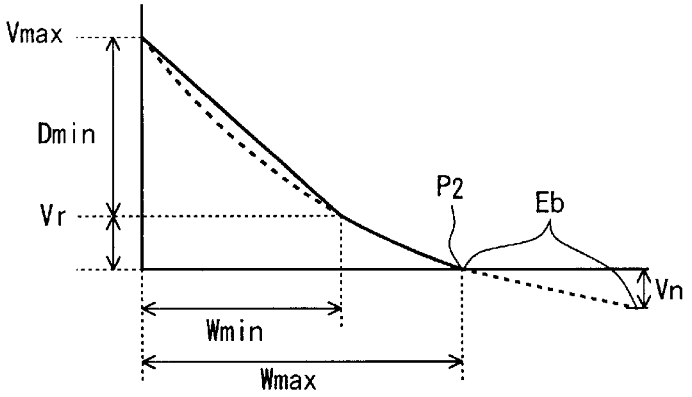

Next, a second modification of the second embodiment will be described while referring to FIGS. 19, 20(*a*), and 20(*b*). The second modification differs from the first modification in that the ground potential Vg of the discharge control circuit 140 is a minimum potential Vn and in that the minimum voltage Vn is a negative potential. This is achieved by connecting the emitter of the transistor Q1 to the negative potential Vn. As a result, as in the second modification of the second embodiment, the falling edge of the output 160 follows the straight line S, and so linearly drops toward the ground potential Vg until point P. However, after point P, the falling edge follows the exponential of the minimum potential Vn (negative potential), and so drops through the ground potential Vg toward the minimum potential Vn. In accordance with this, the discharge pulse signal 170 can be set with a maximum pulse width Wmax that properly controls the pulse drive voltage 160 to the ground potential Vg. Also, the lowering voltage can be generated with a combination of the straight line network system S and the intermediate step Ea of the curved line E. However, there is a need to be careful with this configuration, because if when the pulse width of the discharge pulse signal 170 is set to the maximum pulse width Wmax or greater, then as indicated by the dotted curve from the timing P2 and on in FIG. 20(*a*) and the dotted line Eb in FIG. 20(*b*), the voltage drops to the end portion Eb of the cured line E towards the negative minimum potential Vn.

Compared to the first modification of the second embodiment, the exponential voltage lowering time of the pulse drive voltage 160 is shorter near the ground potential Vg, which enables correction time to be more accurately set.

The ink recording device according to the above-described embodiments is a type that ejects drops of ink that is liquid at room temperature, and so does not require use of a heater, such as the heater 11. However, the present invention can be applied to a hot melt ink recording device which requires the heater 11. For example, the heater 11 can be provided to neat an ink channel, which includes ink chambers, to a temperature in a range from 140° C. in order to melt hot melt ink, which is normally solid at room temperature, to melt the ink to a liquid so that ink droplets can be ejected. The same means can be used as described in the above embodiments to correct variation in ink droplet ejection speed of different ink ejection systems having piezoelectric elements, in order correct ink droplet speed to the same speed, thereby improving precision of where the ink droplets impinge on the recording medium.

What is claimed is:

1. A multi-nozzle type ink jet recording device that ejects ink filling ink chambers from nozzles, the ink jet recording device comprising:

a plurality of piezoelectric elements that change volume in corresponding ink chambers to eject ink from corresponding nozzles;

a signal generator that generates a drive signal for driving the plurality of piezoelectric elements;

a plurality of charge control circuits connected to the signal generator, each of the plurality of charge control circuits being responsive to the drive signal to charge a corresponding piezoelectric element by a predetermined charge amount;

a signal pulse drive circuit that generates a drive voltage in synchronization with the drive signal; and a plurality of discharge circuits each having a discharge path connected between the signal pulse drive circuit and a corresponding one of the charge control circuits, one connection terminal of each piezoelectric element being connected between a corresponding discharge circuit and a corresponding charge control circuit and another connection terminal of each piezoelectric element being connected to ground.

2. The ink jet recording device as claimed in claim 1, wherein each of the plurality of discharge circuits comprises a diode having an anode and a cathode, wherein one connection terminal of each of the plurality of piezoelectric elements is connected between the anode of a corresponding diode and the corresponding charge control circuit.

3. The ink jet recording device as claimed in claim 2, wherein a pulse from the signal pulse drive circuit includes a linear rising edge, and a time constant at the rising edge of the pulse is set to 0.8 to 1.2 times of a multiple of a reciprocal of a natural frequency of a vibration system including a corresponding piezoelectric element.

4. The ink jet recording device as claimed in claim 2, wherein charge amount of each piezoelectric element is determined depending on pulse voltage of the signal pulse drive circuit and pulse width applied to the charge control charge circuit.

5. The ink jet recording device as claimed in claim 2, wherein the ink is a hot melt ink, and further comprising a heater for heating the hot melt ink to a temperature in a range from 80° C. to 140° C., the heater being disposed adjacent to each ink chamber.

6. The ink jet recording device as claimed in claim 2, wherein each charge control circuit that corresponds to a piezoelectric element that in turn corresponds to a nozzle from which ink is to be ejected, starts charging the corresponding piezoelectric element in synchronization with rising edge of the pulse from the signal pulse drive circuit in order to charge the corresponding piezoelectric element with a predetermined particular charge amount, thereby increasing volume of an ink chamber corresponding to the piezoelectric element so that ink is drawn into the ink chamber, and each charge control circuit that corresponds to a piezoelectric element that in turn corresponds to a nozzle from which ink is not to be ejected, is controlled not to charge the corresponding piezoelectric element.

7. The ink jet recording device as claimed in claim 1, wherein a pulse from the signal pulse drive circuit includes a linear rising edge, and a time constant at the rising edge of the pulse is set to 0.8 to 1.2 times of a multiple of a reciprocal of a natural frequency of a vibration system including a corresponding piezoelectric element.

8. The ink jet recording device as claimed in claim 1, wherein charge amount of each piezoelectric element is determined depending on pulse voltage of the signal pulse drive circuit and pulse width applied to the charge control charge circuit.

9. The ink jet recording device as claimed in claim 1, wherein the ink is a hot melt ink, and further comprising a heater for heating the hot melt ink to a temperature in a range from 80° C. to 140° C., the heater being disposed adjacent to each ink chamber.

10. The ink jet recording device as claimed in claim 1, wherein each charge control circuit that corresponds to a piezoelectric element that in turn corresponds to a nozzle from which ink is to be ejected, starts charging the corresponding piezoelectric element in synchronization with rising edge of the pulse from the signal pulse drive circuit in order to charge the corresponding piezoelectric element with a predetermined particular charge amount, thereby increasing volume of an ink chamber corresponding to the piezoelectric element so that ink is drawn into the ink chamber, and each charge control circuit that corresponds to a piezoelectric element that corresponds to a nozzle from which ink is not to be ejected, is controlled not to charge the corresponding piezoelectric element.

11. A multi-nozzle type ink jet recording device that ejects ink filling ink chambers from nozzles, the ink jet recording device comprising:

a plurality of piezoelectric elements that change volume in corresponding ink chambers to eject ink from corresponding nozzles;

a signal generator that generates a drive signal for driving the plurality of piezoelectric elements;

a plurality of charge control circuits connected between the signal generator and one connection terminal of a corresponding piezoelectric element, each of the plurality of charge control circuits being responsive to the drive signal to charge a corresponding piezoelectric element by a predetermined charge amount;

a signal pulse drive circuit that generates a drive voltage in synchronization with the drive signal; and a plurality of discharge circuits each having a discharge path connected between the signal pulse drive circuit and a corresponding one of the charge control circuits, one connection terminal of each piezoelectric element being connected between a corresponding discharge circuit and a corresponding charge control circuit and another connection terminal of each piezoelectric element being connected to ground.

12. The ink jet recording device as claimed in claim 11, wherein each of the plurality of discharge circuits comprises a diode having an anode and a cathode, wherein one connection terminal of each of the plurality of piezoelectric elements is connected between the anode of a corresponding diode and the corresponding charge control circuit.

13. The ink jet recording device as claimed in claim 11, wherein a pulse from the signal pulse drive circuit includes a linear rising edge, and a time constant at the rising edge of the pulse is set to 0.8 to 1.2 times of a multiple of a reciprocal of a natural frequency of a vibration system including a corresponding piezoelectric element.

14. The ink jet recording device as claimed in claim 11, wherein charge amount of each piezoelectric element is determined depending on pulse voltage of the signal pulse drive circuit and pulse width applied to the charge control circuit.

15. The ink jet recording device as claimed in claim 11, wherein the ink is a hot melt ink, and further comprising a heater for heating the hot melt ink to a temperature in a range from 80° C. to 140° C., the heater being disposed adjacent to each ink chamber.

16. The ink jet recording device as claimed in claim 11, wherein each charge control circuit that corresponds to a piezoelectric element that in turn corresponds to a nozzle from which ink is to be ejected, starts charging the corresponding piezoelectric element in synchronization with rising edge of the pulse from the signal pulse drive circuit in order to charge the corresponding piezoelectric element with a predetermined particular charge amount, thereby increasing volume of an ink chamber corresponding to the piezoelectric element so that ink is drawn into the ink chamber, and each charge control circuit that corresponds to a piezoelectric element that in turn corresponds to a nozzle from which ink is not to be ejected, is controlled not to charge the corresponding piezoelectric element.

17. A multi-nozzle type ink jet recording device that ejects ink filling ink chambers from nozzles, the ink jet recording device comprising:

a plurality of piezoelectric elements that change volume in corresponding ink chambers to eject ink from corresponding nozzles;

a signal generator that generates a drive signal for driving the plurality of piezoelectric elements;

a plurality of discharge control circuits connected between the signal generator and one connection terminal of a corresponding piezoelectric element, each of the plurality of discharge control circuits being responsive to the drive signal to discharge a corresponding piezoelectric element by a predetermined charge amount;

a signal pulse drive circuit that is connected in parallel with another connection terminal of a corresponding piezoelectric element, and that generates a drive voltage in synchronization with the drive signal; and a plurality of charge circuits that charge corresponding piezoelectric elements, each of the plurality of charge circuits being connected between a corresponding piezoelectric element and a corresponding discharge control circuit.

18. The multi-nozzle type ink jet recording device as claimed in claim 17, wherein each of the plurality of charge circuits comprises a diode having a cathode and an anode, the cathode being connected to a ground potential, and the anode being connected between a corresponding piezoelectric element and a corresponding discharge control circuit.

19. The multi-nozzle type ink jet recording device as claimed in claim 17, wherein a pulse from the signal pulse drive circuit includes a linear rising edge, and a time constant at the rising edge of the pulse it set to 0.8 to 1.2 times of a multiple of a reciprocal of a natural frequency of a vibration system including a corresponding piezoelectric element.

20. The multi-nozzle type ink jet recording device as claimed in claim 17, wherein charge amount of each piezoelectric element is determined depending on pulse voltage of the signal pulse drive circuit and pulse width applied to a corresponding discharge control circuit.

21. The multi-nozzle type ink jet recording device as claimed in claim 17, wherein the ink is a hot melt ink, and further comprising a heater for heating the hot melt ink to a temperature in a range from 80° C. to 140° C. the heater being disposed adjacent to each ink chamber.

22. The ink jet recording device as claimed in claim 17, wherein each of the plurality of discharge control circuits that corresponds to a piezoelectric element that in turn corresponds to a nozzle from which ink is to be ejected, starts discharging the corresponding piezoelectric element in synchronization with rising edge of the pulse from the signal pulse drive circuit in order to discharge the corresponding piezoelectric element with a predetermined particular charge amount, thereby increasing volume of an ink chamber corresponding to the piezoelectric element so that ink is drawn into the ink chamber, and each charge control circuit that corresponds to a piezoelectric element that in turn corresponds to a nozzle from which ink is not to be ejected, is controlled not to charge the corresponding piezoelectric element.

23. A multi-nozzle type ink jet recording device that ejects ink filling ink chambers from nozzles, the ink jet recording device comprising:

a plurality of piezoelectric elements that change volume in corresponding ink chambers to eject ink from corresponding nozzles;

a signal generator that generates a drive signal for driving the plurality of piezoelectric elements;

a plurality of discharge control circuits connected to the signal generator, each discharge control circuit being responsive to the drive signal to discharge a corresponding piezoelectric element by a predetermined charge amount;

a signal pulse drive circuit that generates a drive voltage in synchronization with the drive signal; and a plurality of diodes each separately connected between the signal pulse drive circuit and a corresponding one of the discharge control circuits, one connection terminal of each piezoelectric element being connected between the discharge control circuit and a cathode terminal of a corresponding diode, and another connection terminal of each piezoelectric element being connected to a ground potential.

24. The multi-nozzle type ink jet recording device as claimed in claim 23, wherein each of the plurality of charge circuits comprises a diode having a cathode and an anode, the cathode being connected to a ground potential, and the anode being connected between a corresponding piezoelectric element and a corresponding discharge control circuit.

* * * * *